United States Patent
Burrows et al.

(10) Patent No.: US 10,932,323 B2
(45) Date of Patent: Feb. 23, 2021

(54) REFLECTOR AND SUSCEPTOR ASSEMBLY FOR CHEMICAL VAPOR DEPOSITION REACTOR

(71) Applicant: Alta Devices, Inc., Sunnyvale, CA (US)

(72) Inventors: Brian Burrows, San Jose, CA (US); Abril Cabreros, Gilroy, CA (US); David M. Ishikawa, Mountain View, CA (US); Brian Brown, Palo Alto, CA (US); Alexander Lerner, San Jose, CA (US)

(73) Assignee: ALTA DEVICES, INC., Sunnyvale, CA (US)

( * ) Notice: Subject to any disclaimer, the term of this patent is extended or adjusted under 35 U.S.C. 154(b) by 198 days.

(21) Appl. No.: 14/817,037

(22) Filed: Aug. 3, 2015

(65) Prior Publication Data
US 2017/0037515 A1  Feb. 9, 2017

(51) Int. Cl.
*C23C 16/458* (2006.01)
*H05B 3/00* (2006.01)
*C23C 16/48* (2006.01)

(52) U.S. Cl.
CPC ....... *H05B 3/0047* (2013.01); *C23C 16/4583* (2013.01); *C23C 16/481* (2013.01)

(58) Field of Classification Search
CPC . H05B 3/0047; C23C 16/481; C23C 16/4583; C23C 16/46; C23C 16/48

(Continued)

(56) References Cited

U.S. PATENT DOCUMENTS

| 808,085 A | 12/1905 | Gustave et al. |
| 4,199,952 A | 4/1980 | Berg |

(Continued)

FOREIGN PATENT DOCUMENTS

| CN | 101689505 A | 3/2010 |
| JP | 02094430 A * | 4/1990 |

(Continued)

OTHER PUBLICATIONS

Spectral Identification of Lighting Type and Character. Sensors 10(4):3961-88 • Apr. 2010. https://www.researchgate.net/publication/223137703_Spectral_Identification_of_Lighting_Type_and_Character. *

(Continued)

*Primary Examiner* — Rudy Zervigon
(74) *Attorney, Agent, or Firm* — Arent Fox LLP

(57) ABSTRACT

A reactor for chemical vapor deposition is equipped with an IR radiation compensating susceptor assembly that supports one or more semiconductor substrates above linear IR heater lamps arranged in a parallel array. A set of primary IR radiation reflectors beneath the lamps directs IR radiation back toward the susceptor in a pattern selected to provide uniform IR irradiation of the susceptor assembly to thereby uniformly heat the substrates. Secondary IR shield reflectors may be provided in selected patterns on the underside of the susceptor assembly as a fine tuning measure to direct IR radiation away from the assembly in a controlled pattern. The combined IR radiation reflectors have an IR signature that compensates for any non-uniform heating profile created by the linear IR heater lamp array. The heating profile of the lamp array might also be tailored in order to reduce the amount of compensation required to be supplied by the IR reflectors.

22 Claims, 3 Drawing Sheets

(58) Field of Classification Search
USPC .......................................... 118/724, 725, 641
See application file for complete search history.

(56) References Cited

U.S. PATENT DOCUMENTS

| | | | |
|---|---|---|---|
| 4,316,430 A | 2/1982 | Jolly et al. | |
| 4,576,436 A | 3/1986 | Daniel | |
| 4,649,261 A | 3/1987 | Sheets | |
| 4,796,562 A | 1/1989 | Bros et al. | |
| 4,836,138 A | 6/1989 | Robinson et al. | |
| 4,908,495 A | 3/1990 | Wilkinson et al. | |
| 4,935,660 A | 6/1990 | Heider et al. | |
| 4,941,429 A | 7/1990 | Wilkinson et al. | |
| 4,972,197 A | 11/1990 | McCauley et al. | |
| 4,975,561 A | 12/1990 | Robinson et al. | |
| 5,074,736 A | 12/1991 | Ishii | |
| 5,179,677 A | 1/1993 | Anderson et al. | |
| 5,195,504 A | 3/1993 | Lane | |
| 5,312,490 A | 5/1994 | Wilkinson | |
| 5,505,805 A | 4/1996 | Papenburg et al. | |
| 5,534,072 A * | 7/1996 | Mizuno | C23C 16/4401 118/728 |
| 5,626,677 A | 5/1997 | Shirahata | |
| 5,683,518 A | 11/1997 | Moore et al. | |
| 5,790,750 A | 8/1998 | Anderson | |
| 5,906,485 A | 5/1999 | Groff et al. | |
| 6,122,440 A | 9/2000 | Campbell | |
| 6,232,580 B1 | 5/2001 | Sandhu | |
| 6,290,522 B1 | 9/2001 | Campolo et al. | |
| 6,310,327 B1 | 10/2001 | Moore et al. | |
| 6,465,761 B2 | 10/2002 | Stevens et al. | |
| 6,540,869 B2 | 4/2003 | Saeki et al. | |
| 6,600,138 B2 * | 7/2003 | Hauf | H01L 21/67115 118/50.1 |
| 6,947,665 B2 | 9/2005 | Garnier et al. | |
| 7,048,233 B2 | 5/2006 | Combes et al. | |
| 7,218,848 B2 | 5/2007 | Hinesley | |
| 7,258,464 B2 | 8/2007 | Morris et al. | |
| 7,479,618 B2 | 1/2009 | Liebeck et al. | |
| 8,008,174 B2 | 8/2011 | He et al. | |
| 8,388,755 B2 * | 3/2013 | Arena | C30B 25/105 118/724 |
| 2002/0007797 A1 | 1/2002 | Stevens et al. | |
| 2003/0029859 A1 | 2/2003 | Knoot et al. | |
| 2004/0221801 A1 | 11/2004 | Ochiai et al. | |
| 2004/0244686 A1 | 12/2004 | Cho et al. | |
| 2005/0008351 A1 * | 1/2005 | Gat | F27B 5/04 392/416 |
| 2006/0222481 A1 | 10/2006 | Foree | |
| 2006/0249073 A1 * | 11/2006 | Asaoka | C30B 19/00 117/84 |
| 2006/0249077 A1 | 11/2006 | Kim et al. | |
| 2008/0268153 A1 | 10/2008 | Kitagawa et al. | |
| 2009/0214785 A1 * | 8/2009 | Arena | C30B 25/105 427/255.28 |
| 2009/0324379 A1 | 12/2009 | He et al. | |
| 2009/0325367 A1 | 12/2009 | He et al. | |
| 2010/0092668 A1 | 4/2010 | Hegedus | |
| 2010/0209626 A1 | 8/2010 | He et al. | |
| 2012/0106935 A1 | 5/2012 | He et al. | |
| 2013/0294756 A1 * | 11/2013 | Lim | H01L 21/67115 392/411 |

FOREIGN PATENT DOCUMENTS

| | | |
|---|---|---|
| JP | H08107078 A | 4/1996 |
| JP | 2001035803 A | 2/2001 |
| JP | 2003051277 A | 2/2003 |
| JP | 2004055595 A | 2/2004 |
| JP | 2005142052 A | 6/2005 |
| JP | 2007231361 A | 9/2007 |
| KR | 100220444 B1 | 6/1999 |
| KR | 19990043658 A | 6/1999 |
| WO | 2006131316 A1 | 12/2006 |

OTHER PUBLICATIONS

International Search Report and Written Opinion dated Jan. 12, 2010 for International Application No. PCT/US2009/045709.
International Search Report and Written Opinion dated May 20, 2010 for International Application No. PCT/US2009/060260.
Non-Final Office Action dated Oct. 30, 2017 for U.S. Appl. No. 14/997,890 of He, G. et al. filed Jan. 18, 2016.
China First Office Action and Search Report corresponding to Chinese Application No. 201510651165.X, dated Aug. 28, 2019 and Aug. 19, 2019.

* cited by examiner

REFLECTOR AND SUSCEPTOR ASSEMBLY FOR CHEMICAL VAPOR DEPOSITION REACTOR

TECHNICAL FIELD

The invention relates to semiconductor processing and, in particular, to substrate heating for formation of uniform thin films on the substrates.

BACKGROUND

In chemical vapor deposition (CVD) reactors, particularly reactors for epitaxial deposition, infrared (IR) heater lamps are used to heat semiconductor substrates. IR heater lamps are intended to heat semiconductor substrates up to 900 degrees Celsius. Compound semiconductor thin film deposition processes are extremely temperature sensitive, often requiring plus or minus five degrees or less deviation from the optimal processing temperature. Put simply, substrate temperature non-uniformity adversely affects thin film deposition quality and reactor yield. Also, the desired uniformity is preferably maintained throughout the entire process, including when ramping the temperature up to the processing temperature and subsequently cooling the substrates, to avoid causing defects in the thin film crystal structure.

Commercial single wafer CVD reactors heat substrates using IR heater lamps packaged in complex assemblies with air and water cooled gold plated IR reflectors arranged in discrete zones and powered by closed loop temperature systems. Reactors in a large format arrangement designed to simultaneously process multiple substrates have constraints that add to the expense of ensuring uniform processing temperature.

Linear IR heater lamps are a suitable alternative to tightly packaged IR heater bulbs with vertical and horizontal filaments for manufacturing a large format heater. Moreover there are benefits to using linear lamps arranged in parallel to create a large format heater covering multiple substrates. Power terminals are located outside the heated zone allowing convenient access; small lamp cross-section enables close spacing for maximum power density; and commercial availability of linear IR heater lamps with reflective coatings applied to one face focus and concentrate IR radiation in a direction. These linear lamps have a known non-uniform heating profile along the length of the filament. This non-uniform heating profile is further aggravated by thermal losses from the substrate to cooler chamber walls and peripheral process components.

One approach to compensating for nascent temperature non-uniformity caused by linear lamps involves limiting substrate placement over the midsection of the linear lamps to allow temperature "roll off" to occur outside the: substrate footprint. In some cases only the middle 50% of the linear lamp has acceptable processing temperature uniformity (less than ten degrees Celsius range). This quality allows linear lamps to produce a small zone of uniform IR radiation that is adequate for substrate processing. However, for large format processing it is undesirable to underutilize linear lamps to this extent due to system footprint and processing volume considerations. The need therefore exists for some other method to compensate for temperature non-uniformity over linear IR heater lamp arrays.

One method to compensate for roll off is to add supplemental heating. For example, linear IR heater lamps can be placed along the cool chamber walls perpendicular to the linear lamp array. Energy from supplemental linear IR lamps can be tuned to compensate for edge losses and lamp roll off. However, this approach is difficult to package, limited by the available length of linear lamps, and can even compound thermal non-uniformity within the reactor.

Another approach, described in published application 2010/0209206, assigned to the assignee herein, uses split filament lamps to achieve a desired susceptor temperature by varying the outputs of different lamps in a heater lamp array. However, local overheating along the length of a lamp can reduce its useful lifetime due to filament damage or lamp quartz blistering.

SUMMARY

A method to compensate for roll off is to add IR reflectors, such as opaque quartz plates, under both ends of the linear IR heater lamps. The purpose of these reflectors is to focus radiation toward the edge of the heated zone. Previously, any reflectors under the heater lamps were uniform in their dimensions and IR reflective properties. Accordingly, the present invention provides a patterned IR reflector that compensates for linear IR heater lamp non-uniformity. In particular, in an embodiment according to the present invention, an IR reflector under the heating lamps is wider in the end sections than in the center. In another embodiment, IR reflectors may only be provided in the end sections and be absent in the center. Such IR reflectors could be constructed of opaque quartz (a bulk scatterer of IR radiation) or alternatively of gold-plated copper. In the latter instance, it is possible to alter the IR reflective properties along the length of the reflector, e.g. by incorporating a graphite coating, instead of gold plating, in those central locations where it is desired to reduce or block IR reflection, thus producing a desired spatial IR reflection pattern.

Secondarily, uniformity of heating may be fine-tuned by using a low-thermal mass susceptor assembly whose emissivity/reflectivity is likewise patterned, e.g. by the addition of IR shield reflectors, in order to control the amount of incident radiation that the susceptor absorbs and/or reflects away from the substrate, provided care is taken not to add to the thermal mass of the susceptor which would slow down the heating process. Thus, an IR radiation compensating susceptor assembly in one embodiment according to the present invention may comprise a graphite susceptor with a pocket designed to hold one or more semiconductor substrates over thin refractory metal IR shield reflectors (such as of molybdenum). Together, the main IR lamp reflectors under the lamps and the secondary shield reflectors in the susceptor pocket would collectively have an IR reflectivity with a controlled signature profile that compensates for non-uniform heating profiles of the linear IR heater lamp array. Heat transfer simulations and high fidelity thermal models may be readily employed in the reactor design, so as to tune the overall IR reflector profile that is to be used in the particular reactor.

Nevertheless, the heating lamps might also be constructed to provide power outputs designed to produce as uniform as possible heating of the wafer substrates on the susceptor, thereby minimizing the amount of compensation that the IR radiation reflectors have to perform. Thus, those heating lamps located proximate to edges of the susceptor may provide greater power output than more centrally located heating lamps since there tend to be fewer numbers of lamps at susceptor edges to contribute to susceptor heating. The lamps themselves, e.g. tube lamps, may be constructed to provide different amounts of output along their length according to a preferred pattern, again with greater output at susceptor ends than in the middle so that the overall effect of lamp heating upon the susceptor is already as uniform as possible even before the introduction of the IR radiation reflectors.

IR radiation reflector. The IR radiation reflector has an IR reflectivity controlled signature that compensates for the non-uniform heating profile created by a linear IR heater lamp array. Strips of various widths can be arranged below the lamps to reflect radiation from the lamps toward the susceptor according to a desired global or wafer-by-wafer distribution pattern. The primary IR reflectors may be made from opaque quartz (a bulk IR scatterer) or gold-plated copper. Additional secondary IR shield reflectors might be placed in selected configurations in the pockets on the underside of the susceptor to direct some IR radiation away from the susceptor (provided any such secondary shield reflectors have sufficiently low thermal mass). The secondary IR radiation reflectors may be produced from a thin (0.020 thick) piece of refractory metal, preferably polished molybdenum foil that is stamped, chemically etched, laser cut; or otherwise machined to produce a precise silhouette profile. Polished foil has a known IR reflectivity at elevated processing temperatures. The net area covered by the IR reflectors determines the proportion of incident IR radiation from the lamps that is reflected. Furthermore, by controlling the size and arrangement of openings in the reflector it is possible to produce a unique thermal signature on the susceptor and substrate. Alternatively, the IR reflective properties of the reflectors may vary spatially, e.g. with an IR absorptive coating. The IR radiation reflectors may be configured to distribute heat according to a desired global pattern or a desired wafer-by-wafer pattern, in a manner that will successfully compensate for any non-uniform heating of the susceptor and the one or more wafer substrates thereon.

Susceptor assembly. The susceptor assembly is comprised of a graphite susceptor with a pocket designed to hold a semiconductor substrate. If desired, one or more low-thermal-mass IR shield reflectors may be included in the pocket to supplement the main IR lamp reflectors. The susceptor can be machined from graphite and is best made from thermal paralytic graphite (TPG) which has a high thermal conductivity in the plane of the pocket.

Multiple substrates. Reflecting excess radiation allows temperature control of multiple substrates arranged over a linear lamp array. Furthermore, low mass construction facilitates thermal uniformity under ramp and steady state heating conditions.

DETAILED DESCRIPTION

The present invention is applicable to a variety of possible reactors where elevated temperature uniformity of substrates is critical or high desired, especially for producing uniform deposition of materials on such substrates. Although the example given here is a CVD cold-wall reactor where the heaters are in the form of one or more linear lamp arrays, other similar reactors are understood to be encompassed by this invention. The improvement herein provides a process kit assembly for radiantly heated susceptors, wherein one or more IR reflector elements compensates for a non-uniform heating profile from whatever kind of heater is employed by the reactor.

Figure 1:
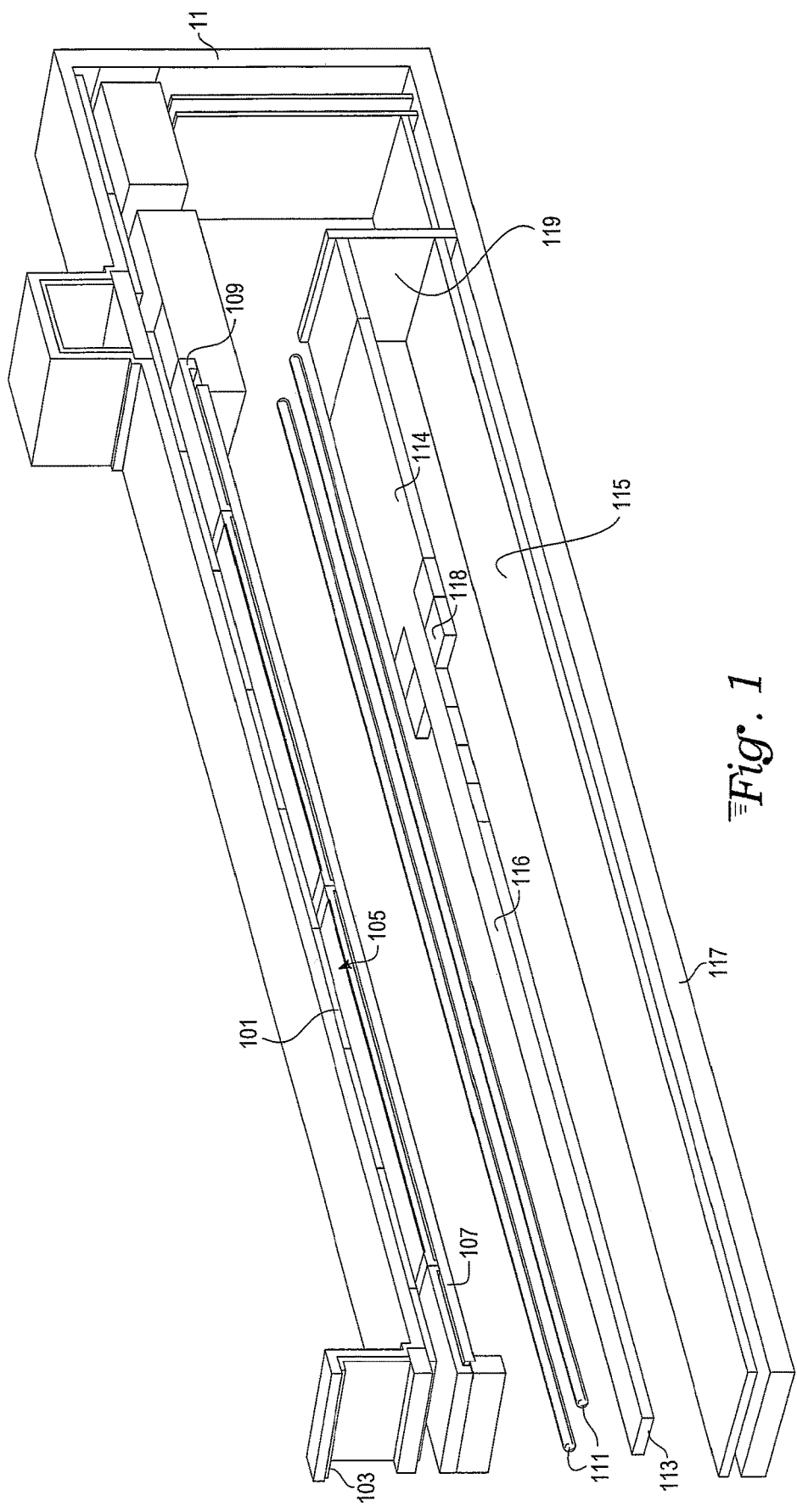
FIG. 1 is a perspective sectional view of the right half of a CVD reactor of the type for deposition processing of multiple semiconductor substrates at one time, with the left half being symmetrically identical, and with IR radiation reflectors in accord with an embodiment of the present invention.

In FIG. 1, a portion of cold wall reactor 11 supports a showerhead diffuser plate 101 above a gas supply manifold 103 and showerhead assembly. One end of the reactor 11 is seen to the right of the figure, while the left hand side of the figure corresponds to a center portion of the reactor 11, with the opposite end of the reactor out of view beyond the left side of the figure. (As the reactor 11 generally exhibits mirror symmetry, nothing essential is lost by only showing half of the reactor.) A showerhead, not shown, directs reactant gas towards susceptor 105 that seats substrates, not shown. The substrates are preferably rectangular have X and Y axes, with one of the axes aligned in the direction of travel through the reactor. Beneath susceptor 105 is a transparent carrier 107 which is supported by legs 109. Infrared radiation is electrically generated by linear tubular lamps 111 that are parallel and mutually spaced apart in a plane above a reflector structure 113 that forms the primary IR reflectors of the present invention. The lengthwise direction of the lamps 111 is aligned with the X or Y axis of the substrates, which may be either in the direction of travel or perpendicular to the direction of travel. In spite of the use of the IR reflector structure 113 to more uniformly distribute the heating of the susceptor and the wafer substrates situated thereon, the heating lamps 111 themselves may be constructed to reduce the amount of thermal compensation needed to be provided by the reflector structure 113. For example, lamps 111 at the susceptor edge may provide higher output power levels, since there will generally be fewer lamps contributing to the susceptor heating at the edge than for the susceptor center. Likewise, the lamps 111 may themselves have a non-uniform output along their length such that lamp centers have lower energy output than lamp ends. Even so, this invention will also work with lamps with uniform outputs or an array of lamps all having the same outputs, but with greater thermal compensation then being required to be supplied by the IR reflectors.

Primary IR reflectors 113 are reflectors beneath the IR lamps may be formed of a conventional IR reflecting material such as opaque quartz, but unconventionally provide a spatial IR reflection pattern that compensates for the non-uniform irradiation of the susceptors 105 from the lamps 111 themselves, for example with wider end portions 114. The center portion 116 of the IR reflectors 113 may be thinner, as seen here, or absent altogether. The relative lengths of the wider end portions 114 and thinner (or absent) center portion 116 may be adjusted on a case-by-case basis by providing removable segments 118. The wider end portion 114 reflects more of the IR radiation from the lamps 113 toward the susceptors 105 at the ends of the reactor 11, thereby compensating for the overall lower IR radiation from the lamps in those end regions of the reactor. The narrower center portion 116 reflects of the IR radiation. Together, this gives the IR reflector structure 113 a specified IR reflection profile that compensates for the collective lamp output, resulting in more uniform heating of the susceptors 105 and of the substrates thereon.

Alternative methods of providing an IR reflective pattern is to alter the IR reflective properties of the reflector structure 113 other than by (or in addition to) changing the width. For example, if the reflecting material of the reflector 113 is a gold-plated copper structure, replacing the gold plating with a graphite coating in central areas 116 of the reflector will lower the IR reflectivity in those areas. The end areas 114 with the gold plating will have higher IR reflectivity.

Optionally, secondary IR reflectors (seen better in FIG. 5) may be mounted on the carrier 107 in a pocket beneath the susceptor 105, facing the IR lamps 111 to reflect heat radiation away from the susceptor 105 in order to further distribute heat more uniformly and avoid hot zones. The secondary IR reflector structure may be a thin refractory metal foil that may be stamped, chemically etched, laser cut, or otherwise machined to produce a precise silhouette profile. The polished foil, preferably composed of molybdenum, has known infrared reflectivity at elevated temperatures that can be mathematically modeled. Any such secondary reflectors should have a low thermal mass to minimize slowdown of substrate heating. They are useful as inserts for fine tuning of the IR profile, as needed, for example as the lamps age.

The principal heat transfer from the lamps 111 to the susceptor 105 is by IR radiation, both direct radiation and radiation reflected by the primary reflector structure. The reflective profile is one that directs radiation away from walls of the housing and towards susceptors 105 through the transparent carrier 107.

Beneath the primary reflector structure 113 may be an inner chamber liner 115 that can be graphite or ceramic, serving to support the reflector structure 113 by leg 119 such that the reflector structure is only a few millimeters from the lamps 111, causing the temperature of the reflector structure 113 to be in the neighborhood of 1100 degrees C. Outer chamber wall 117 is part of the cold wall rector structure 11 and provides support for the reflector structure at its opposite end so that the reflector structure is supported at opposite lateral ends by legs.

Figure 2A:
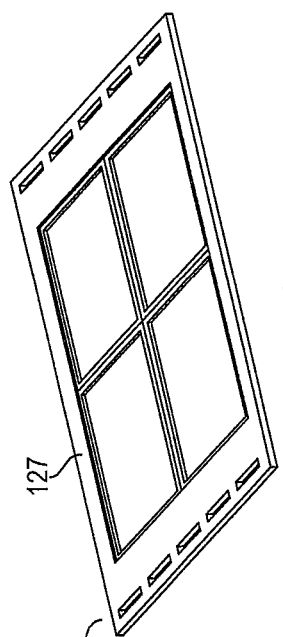
FIGS. 2A and 2B are, respectively, a perspective view and an enlarged exploded view of a susceptor heat distribution assembly used in the reactor of FIG. 1.
Figure 2B:
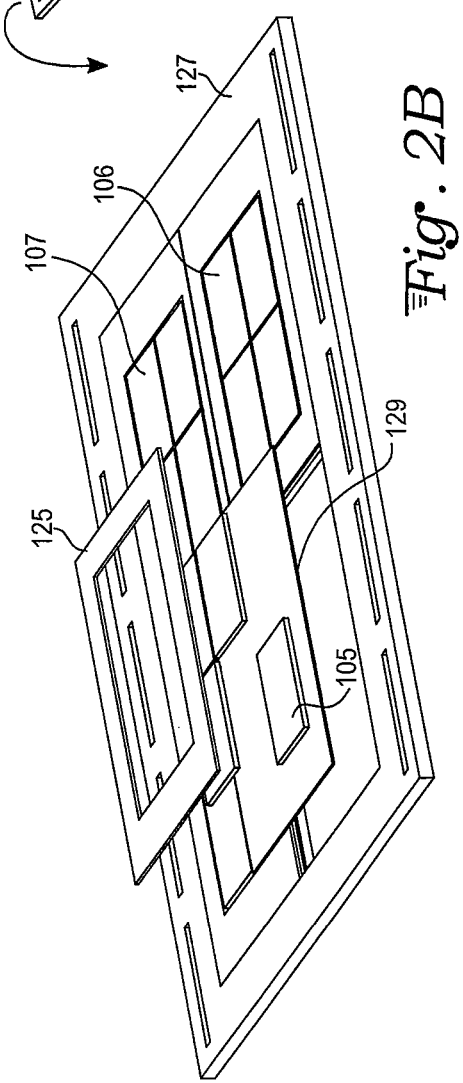

With reference to FIGS. 2A and 2B, a susceptor heat distribution assembly 127 has a graphite susceptor 105, which is one of 4 similar susceptors in a 2×2 array in a ceramic holder. Each susceptor here carries a substrate in a shallow indentation, not shown, for reactive gas deposition in a reactor. A 2×2 array of four susceptors resides below a 2×2 array of showerheads, also not shown. Each array of 4 susceptors is supported by a transparent quartz plate 129. The 4 susceptors are surrounded by a graphite frame 125 also supported by the quartz plate 129. The quartz carrier allows infrared radiation to pass through the carrier to the susceptors where the infrared radiation tends to be absorbed. The graphite frames 125 are more absorptive of infrared radiation than the susceptor structures because the reflector structures are patterned to direct heat away from the susceptors in a preferential manner, with reduced heat to the borders 125 and even less heat toward the walls. The radiation distribution pattern provided by the reflector structures may be modeled on a global basis for the entire array of susceptors 105, or on a susceptor-by-susceptor basis.

Figure 3:
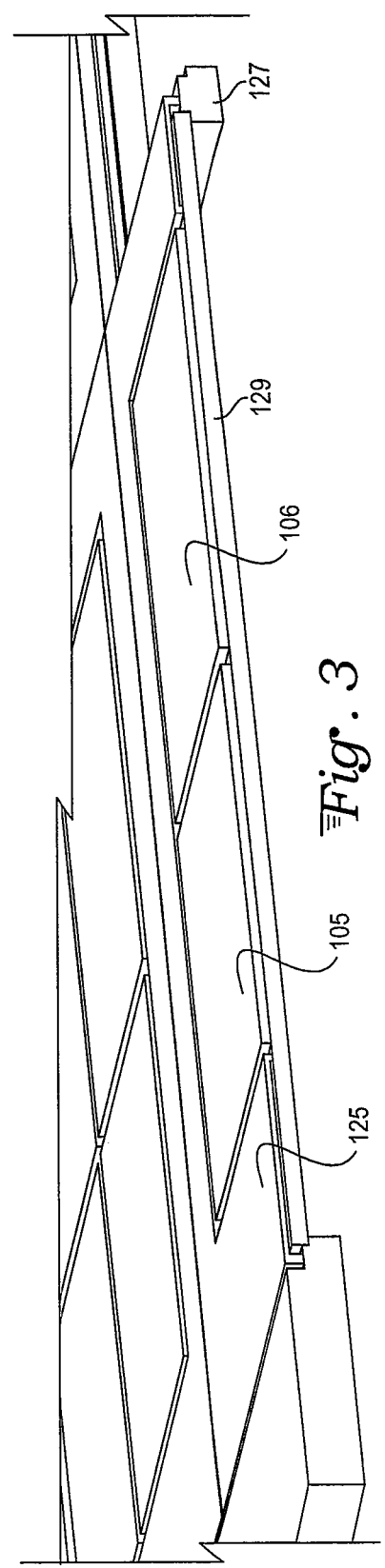
FIG. 3 is a detailed perspective view of a portion of the heat distribution assembly of FIGS. 2A and 2B.

In FIG. 3 a graphite frame 125 is seen surrounding susceptors 105 and 106. Each susceptor has a pocket or indentation carrying a wafer substrate, not shown, upon which high temperature MOCVD reactions are carried out. Substrates are heated by conduction from the associated susceptor and are intended to be at high temperatures needed for CVD reactions, and in comparison with surrounding structures. A quartz plate 129 provides support for both susceptors 105 and 106, as well as for the graphite border 125. Note that only a small portion of the quartz plate 129 and the graphite borders 125 make contact with the ceramic holder 127.

Figure 4:
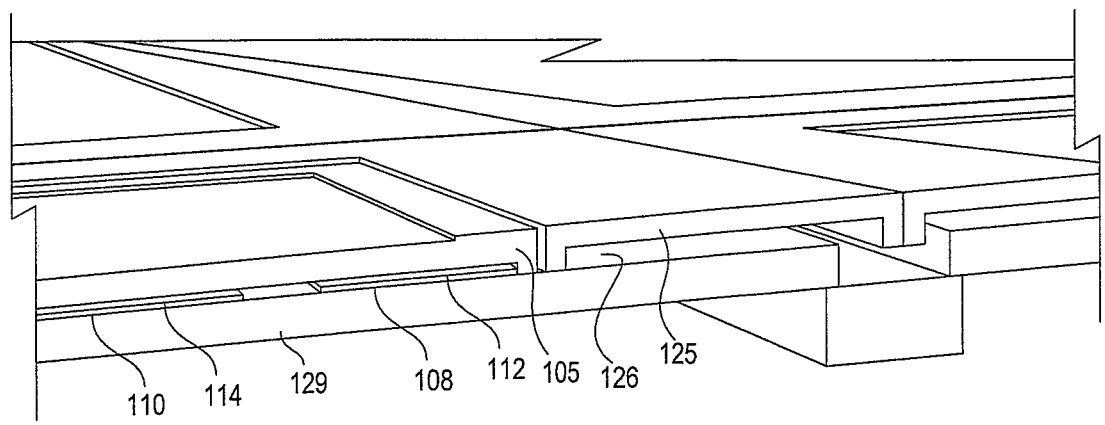
FIG. 4 is a detailed perspective view of an alternate heat distribution assembly portion.

In FIG. 4, the graphite susceptor 105 is shown to have interstitial pockets in a lower surface relative to a quartz plate 129 upon which the susceptor rests. The pockets have dimensions for optionally seating reflective elongated metal strips 112, 114 of a secondary IR reflector structure, which may have a lengthwise direction parallel to the axis of tubular heat lamps. Several parallel, spaced apart strips are disposed on the underside of susceptors to reflect and thereby shield infrared light from the heating lamps so that a desired uniform heating pattern in a group of susceptors can be fine-tuned. The susceptors are intensely heated by the lamps, which may have some heat roll off in the surrounding graphite border and further roll off toward the reactor wall in the direction of a holder that borders the wall to the extent the primary IR reflectors below the lamps may be unable to fully compensate with their own spatial reflective pattern. Therefore, to supplement the primary reflectors, and to fine-tune the IR irradiation to more fully ensure uniform heating of the susceptors, reflective strips in the center of a susceptor array would be somewhat wider, i.e. more area-wise reflectivity because heat is conducted away in all directions, and reflective strips further from the center of a susceptor array would be somewhat narrower, i.e. less reflectivity since heat is conducted away in fewer directions, being limited by a graphite border contacting an insulative holder.

Figure 5:
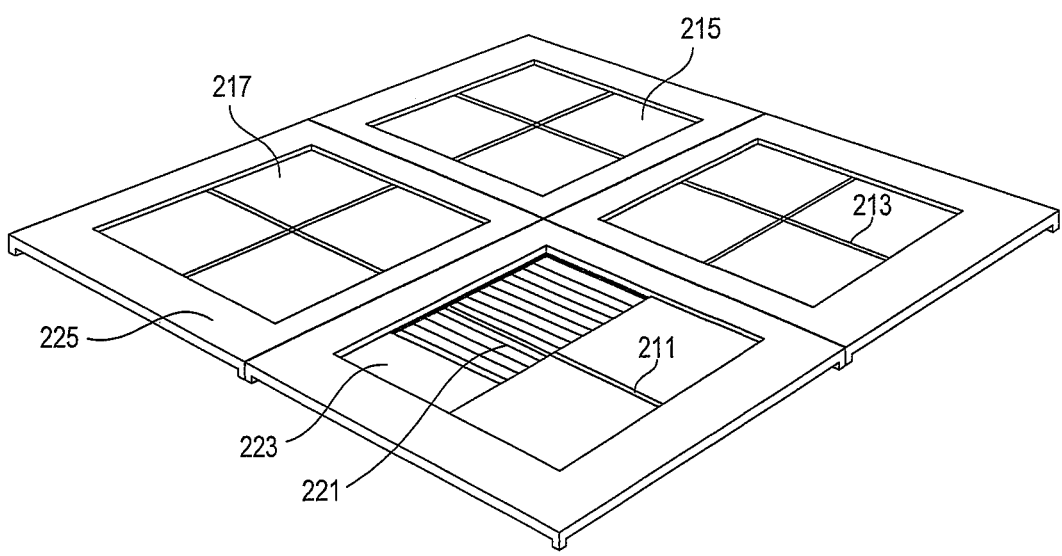
FIG. 5 is a top perspective view of an alternate heat distribution assembly of the type shown in FIG. 4.

With reference to FIG. 5, each array of four susceptors 211, 213, 215, and 217 has a plurality of parallel secondary reflective strips 221 immediately below the susceptors and above the quartz plate 223 that is above an array of parallel infrared tubular heating lamps, not shown, aligned perpendicular to the parallel reflective strips. The strips are configured to produce uniform heating in the susceptors and less heating in the borders, not shown and still less heat in the insulative ceramic holder 225. Primary reflectors, previously discussed with reference to FIG. 1 but not seen here, are disposed below the heating lamps to direct radiation upwardly toward the susceptors, while the secondary reflective strips 221 are disposed to reflect radiation downwardly, away from the susceptors. A multi-bounce effect is produced for the radiation, providing uniform heat distribution in the susceptors.

To obtain a desired heating pattern in the susceptor 105, secondary reflector metal strips or discs 107 may be positioned immediately beneath the susceptor 105, as described below, with the shiny reflective surface facing the IR lamps 111 to direct radiation back toward the lamps 111 and away from portions of the susceptor 105, thereby concentrating heat in desired areas, say beneath a substrate. Once again, such secondary reflective strips create a desired heat profile in the susceptor 105, tending to keep heat away from the walls of the reactor 11 and portions of the susceptor support structure where no susceptors are located.

The silhouette profile of the secondary IR reflector structure 107 is characterized by the number and size of openings wherein the openings are optimized to control radiation heat transfer. A reflector with no openings reflects nearly all incident radiation thereby minimizing radiation heat transfer from the IR lamps to the susceptor. By contrast a reflector with a large total open area, and a small remaining area of reflective material, allows nearly all incident radiation to pass from the IR lamps to the susceptor.

The number and size of openings is tuned to produce an IR reflectivity controlled signature or distribution pattern that effectively compensates for the non-uniform heating profile created by a linear IR heater lamp array. IR reflectors with a small total open area are installed under substrates exposed to higher than average radiation from the linear IR heater lamp array, such as near the lamp midsection. IR reflectors with large total open area are installed under substrates exposed to lower than average radiation from the linear IR heater lamp array, such as near the lamp ends. IR reflectors with small total open area are best produced using thin refractory metal foil. The reflectivity for these reflectors can be decreased by patterning an array of openings, such as circles, squares, rectangles, or other geometric shapes, in order to increase the total open area. The openings can be regularly spaced to uniformly reflect radiation away or linearly gradated to bias radiation to one side of the substrate. An alternative embodiment involves arranging individual refractory foil strips of equal or different widths under the susceptor instead of machining slots into an inseparable piece of foil. IR reflectors with large total open area are best produced using refractory metal wire, typically 0.005 inch diameter wire or larger, woven into a thin mesh. The reflectivity for these reflectors can be increased by using larger diameter wire and by weaving a tighter mesh to decrease wire spacing. It is a combination of heating lamp output distribution, underside IR reflector distribution that collectively yields the desired uniform heat profile, either on a global basis or wafer-by-wafer basis.

The reflective metal foil is in the range of 0.015 to 0.030 inches (approx. 380 to 760 µm) thick, with a preferred thickness of 0.020 inches (500 µm). Such a shiny thin foil has low thermal mass that prevents conductive heat transfer from the secondary reflector structure 107 to the substrate and susceptor assembly 105.

What is claimed is:

1. A substrate heating apparatus for a MOCVD reactor comprising:
    a susceptor having a top side and a bottom side opposite the top side and configured to carry on the top side at least one substrate for heating by irradiation of the susceptor, wherein the top side includes an indention portion to support the at least one substrate;
    a susceptor heat distribution assembly having an irradiation absorption frame configured to surround the susceptor and having a transparent surface configured to support the susceptor and the irradiation absorption frame;
    infrared heating lamps disposed below the transparent surface of the susceptor heat distribution assembly and the bottom side of the susceptor, the infrared heating lamps irradiating the susceptor via the transparent surface with infrared light; and
    a primary reflector structure located below the infrared heating lamps, the primary reflector structure having a reflective side facing both the infrared heating lamps and the susceptor, and the primary reflector structure being configured to reflect the infrared light and distribute the reflected infrared light across the susceptor in a desired pattern selected so as to provide uniform heating of the susceptor and thereby also uniform heating of the at least one substrate carried by the susceptor.

2. The apparatus of claim 1, wherein the primary reflector structure is wider at end portions of the infrared heating lamps in relation to central portions of the infrared heating lamps.

3. The apparatus of claim 1, wherein the primary reflector structure is located only in relation to end portions of the infrared heating lamps and is absent in relation to central portions of the infrared heating lamps.

4. The apparatus of claim 1, wherein the primary reflector structure is constructed from an opaque quartz material that produces bulk scattering.

5. The apparatus of claim 1, wherein the primary reflector structure is constructed from gold-plated copper material.

6. The apparatus of claim 1, wherein the primary reflector structure is characterized by a relatively higher infrared reflectivity at end portions of the infrared heating lamps in comparison to a lower infrared reflectivity in adjacent central portions of the infrared heating lamps.

7. The apparatus of claim 6, wherein the primary reflector structure has a graphite coating in relation to the adjacent central portions of the infrared heating lamps.

8. The apparatus of claim 1, further comprising a set of one or more infrared low-thermal-mass shielding reflectors that are located underneath the susceptor, the shielding reflectors configured to reflect a portion of infrared light away from the susceptor in a desired pattern selected to fine tune uniform heating of the susceptor.

9. The apparatus of claim 8, where the shielding reflectors are parallel strips of metal of equal width.

10. The apparatus of claim 8, wherein the shielding reflectors are parallel strips of metal of differing widths.

11. The apparatus of claim 8, wherein the shielding reflectors are disks.

12. The apparatus of claim 8, wherein the shielding reflectors are wire mesh.

13. The apparatus of claim 8, wherein the susceptor is formed to seat the shielding reflectors.

14. The apparatus of claim 1, wherein the infrared heating lamps are constructed and disposed to provide a desired power output pattern.

15. The apparatus of claim 14, wherein the infrared heating lamps located proximate to edges of the susceptor provide greater power output than more centrally located heating lamps.

16. The apparatus of claim 1, wherein the infrared heating lamps are linear tubes.

17. The apparatus of claim 1, further comprising reflectors disposed on sides of the infrared heating lamps.

18. The apparatus of claim 1, wherein the susceptor carrying at least one substrate includes the susceptor carrying a plurality of substrates.

19. The apparatus of claim 18, wherein the plurality of substrates is carried in an array of substrates.

20. The apparatus of claim 18, wherein the plurality of substrates is carried in multiple arrays of substrates with spacing between arrays.

21. A substrate heating structure for a MOCVD reactor comprising:
    a susceptor having a top side and a bottom side opposite the top side and configured to carry on the top side at least one substrate for heating by irradiation of the susceptor, wherein the top side includes an indention portion to support the at least one substrate;
    a susceptor heat distribution assembly having an irradiation absorption frame configured to surround the susceptor and having a transparent surface configured to support the susceptor and the irradiation absorption frame;
    infrared heating lamps disposed below the transparent surface of the susceptor heat distribution assembly and the bottom side of the susceptor, the infrared heating lamps irradiating the susceptor via the transparent surface with infrared light; and a primary reflector structure located below the infrared heating lamps, the primary reflector structure directing radiation from the infrared heating lamps toward the susceptor; and a plurality of spaced apart secondary reflectors, disposed between the infrared heating lamps and the susceptor heat distribution assembly, in positions directing radiation from the infrared heating lamps away from the susceptor, with a net gain of heat in the susceptor, wherein the primary reflector structure and the plurality of spaced apart secondary reflectors are configured to distribute heat across the susceptor in a desired pattern.

22. The substrate heating structure of claim 21, wherein the transparent surface is formed of a quartz plate, the transparent surface and the susceptor are formed to seat the plurality of spaced apart secondary reflectors.

\* \* \* \* \*